(12) United States Patent
Huang et al.

(10) Patent No.: US 10,847,619 B2
(45) Date of Patent: Nov. 24, 2020

(54) SUPPERLATICE CHANNEL INCLUDED IN A TRENCH

(71) Applicant: Intel Corporation, Santa Clara, CA (US)

(72) Inventors: Cheng-Ying Huang, Portland, OR (US); Matthew V. Metz, Portland, OR (US); Willy Rachmady, Beaverton, OR (US); Gilbert Dewey, Hillsboro, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/325,449

(22) PCT Filed: Sep. 30, 2016

(86) PCT No.: PCT/US2016/054911
§ 371 (c)(1),
(2) Date: Feb. 14, 2019

(87) PCT Pub. No.: WO2018/063372
PCT Pub. Date: Apr. 5, 2018

(65) Prior Publication Data
US 2019/0172911 A1    Jun. 6, 2019

(51) Int. Cl.
*H01L 21/02* (2006.01)
*H01L 29/15* (2006.01)
(Continued)

(52) U.S. Cl.
CPC ...... *H01L 29/155* (2013.01); *H01L 21/02164* (2013.01); *H01L 29/423* (2013.01);
(Continued)

(58) Field of Classification Search
CPC ..... H01L 29/66; H01L 29/155; H01L 29/785; H01L 29/06; H01L 29/78; H01L 29/15;
(Continued)

(56) References Cited

U.S. PATENT DOCUMENTS

2005/0130358 A1    6/2005  Chidambarrao et al.
2013/0252361 A1    9/2013  Li et al.
(Continued)

OTHER PUBLICATIONS

The International Searching Authority, Written Opinion of the International Searching Authority and the International Search Report dated Jun. 26, 2017 in International Application No. PCT/US2016/054911, 10 pages.
(Continued)

*Primary Examiner* — Chuong A Luu
(74) *Attorney, Agent, or Firm* — Trop, Pruner & Hu, P.C.

(57) ABSTRACT

An embodiment includes an apparatus comprising: a trench included in an insulation layer that is formed on a substrate, the trench having a top portion and a bottom portion between the top portion and the substrate; a first layer which comprises a first material and is included in the bottom portion; and a superlattice, in the trench and on the first layer, including second and third layers that directly contact each other; wherein: (a) the second and third layers respectively include second and third materials, (b) the second and third materials have different chemical compositions from each other, and (c) the first layer is thicker than each of the second and third. Other embodiments are described herein.

25 Claims, 7 Drawing Sheets

(51) Int. Cl.
    *H01L 29/423* (2006.01)
    *H01L 29/78* (2006.01)
    *H01L 29/66* (2006.01)

(52) U.S. Cl.
    CPC ............ *H01L 29/66* (2013.01); *H01L 29/785* (2013.01); *H01L 2029/7858* (2013.01)

(58) Field of Classification Search
    CPC ............... H01L 29/7853; H01L 29/423; H01L 29/7851; H01L 29/66803; H01L 29/66795; H01L 21/02; H01L 21/76; H01L 21/762; H01L 21/3065; H01L 21/76232; H01L 21/823431; H01L 21/02164; H01L 2029/7858
    USPC .......................................................... 257/15
    See application file for complete search history.

(56) References Cited

U.S. PATENT DOCUMENTS

| | | | |
|---|---|---|---|
| 2014/0175378 A1* | 6/2014 | Goel | H01L 21/764 257/15 |
| 2014/0217499 A1 | 8/2014 | Lee et al. | |
| 2015/0162447 A1 | 6/2015 | Lee et al. | |
| 2016/0099317 A1* | 4/2016 | Mears | H01L 21/324 257/19 |

OTHER PUBLICATIONS

Wikipedia, "Monolayer", Mar. 9, 2016, three pages, https://en.wikipedia.org/wiki/Monolayer.

Huang, et al., "Incorporation of indium and gallium in atomic layer epitaxy of InGaAs on InP substrates", Journal of Crystal Growth, 2011, pp. 60-64, vol. 321, Elsevier B.V.

Wikipedia, "List of semiconductor materials", Aug. 8, 2016, 24 pages, https://en.wikipedia.org/wiki/List_of_semiconductor_materials.

Gerard, et al., "Structural and optical properties of high quality InAs/GaAs short-period superlattices grown by migration-enhanced epitaxy", Applied Physics Letters, Jan. 2, 1989, pp. 30-32, vol. 54, Issue 1, American Institute of Physics.

Goldstein, et al., "Growth by molecular beam epitaxy and characterization of InAs/GaAs strained-layer supelattices", Applied Physics Letters, Nov. 15, 1985, pp. 1099-1101, vol. 47, Issue 10, American Institute of Physics.

Kaspi, et al., "Digital alloy growth in mixed As/Sb heterstructures", Journal of Crystal Growth, Apr. 2003, pp. 515-520, vol. 251, Elsevier B.V.

Elias, et al., "Formation of InGaAs fins by atomic layer epitaxy on InP sidewalls", Japanese Journal of Applied Physics, Jun. 2, 2014, pp. 065503-1 to 065503-5, vol. 53, The Japan Society of Applied Physics.

Fukui, et al., "(InAs)(GaAs) Layered Crystal Grown by MOCVD", Japanese Journal of Applied Physics, Aug. 1984, pp. L521-L523, vol. 23, No. 8.

* cited by examiner

SUPPERLATICE CHANNEL INCLUDED IN A TRENCH

TECHNICAL FIELD

An embodiment addresses semiconductor devices formed in trenches.

BACKGROUND

A variety of electronic and optoelectronic devices can be enabled by developing, for example, high quality III-V semiconductors on elemental silicon (Si) substrates or IV semiconductors on Si substrates. Surface layers capable of achieving the performance advantages of III-V or IV materials may host a variety of high performance electronic devices such as CMOS and quantum well (QW) transistors fabricated from extremely high mobility materials such as, but not limited to, indium antimonide (InSb), indium arsenide (InAs), germanium (Ge), and silicon germanium (SiGe). Optical devices, such as lasers, detectors and photovoltaics, as well as electronic devices may be fabricated from various other direct band gap materials, such as, but not limited to, gallium arsenide (GaAs) and indium gallium arsenide (InGaAs).

The growth of III-V and IV materials upon Si substrates, however, presents many challenges. Crystal defects are generated by lattice mismatch, polar-on-nonpolar mismatch, and thermal mismatch between the III-V semiconductor epitaxial (EPI) layer and the Si semiconductor substrate or the IV semiconductor EPI layer and the Si semiconductor substrate. When the lattice mismatch between the EPI layer and substrate exceeds a few percent, the strain induced by the mismatch becomes too large and defects are generated in the EPI layer. Once the film thickness is greater than the critical thickness (i.e., film is fully strained below this thickness and partially relaxed above this thickness), the strain is relaxed by creating misfit dislocations at the film and substrate interface as well as in the EPI film. The EPI crystal defects may be in the form of threading dislocations, stacking faults and twins. Many defects, particularly threading dislocations and twins, tend to propagate into the "device layer" where the semiconductor device is fabricated. Generally, the severity of defect generation correlates to the amount of lattice mismatch between the III-V semiconductor and the Si substrate or the IV semiconductor and the Si substrate.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Figure 1:
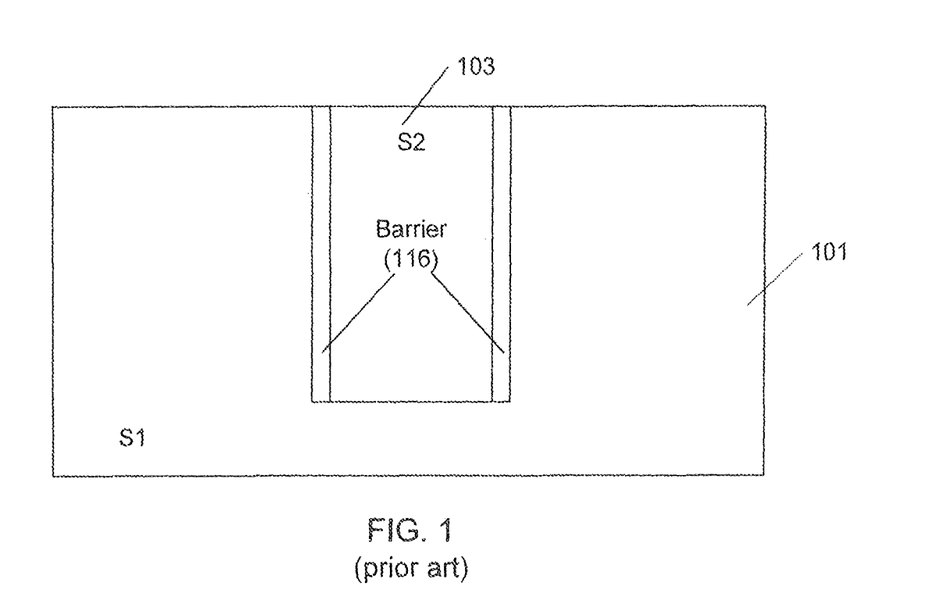
FIG. 1 depicts a conventional trench for aspect ratio trapping.

A conventional technique for managing lattice mismatch, discussed above, includes Aspect Ratio Trapping (ART). ART is based on threading dislocations that propagate upwards at a specific angle. As seen in FIG. 1, in ART a trench is made in a first semiconductor (S1) 101 (or, for example, dielectric) with a high enough aspect ratio (height: width) such that the defects in a second semiconductor (S2) 103 located in the trench terminate on the sidewall of the trench and any layer above the terminations is substantially defect free. The trench may or may not include a barrier 116.

Figure 2:
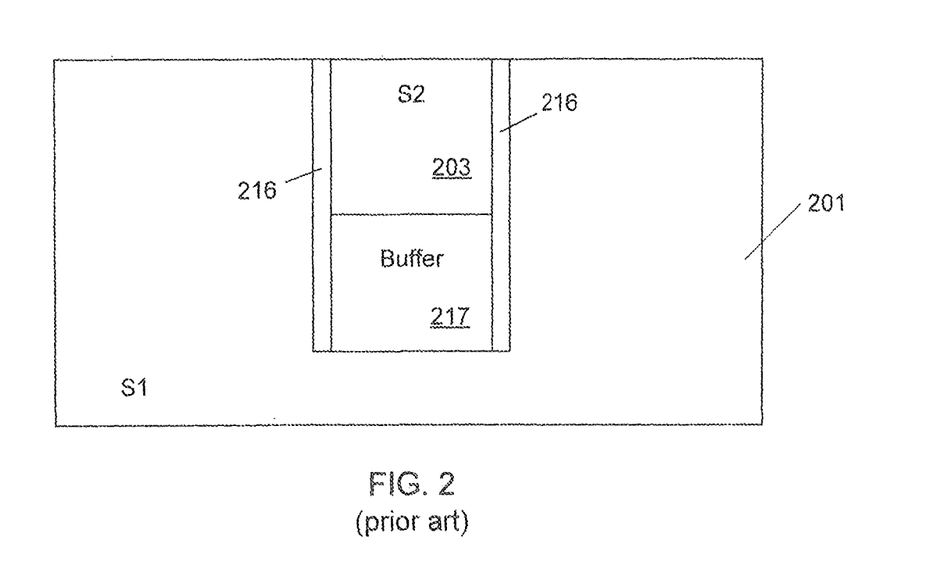
FIG. 2 depicts a conventional buffer layer included in a trench.

As seen in FIG. 2, another conventional technique to manage defects in lattice mismatched configurations involves deposition of a thick buffer 217 (e.g., 0.5 or more microns thick) that bridges the lattice constant difference between the S1 substrate 201 and the layers of interest (e.g., device layers including III-V materials S2 203 and the like). The buffer may be between barrier portions 216. In such conventional techniques anneals and compositional grading processes are used to "bend" the defects into each other within the thick buffer so the defects annihilate. Many thick buffer techniques are time consuming, expensive, include undesirable surface roughness of the buffer, and the minimum defect density still remains high.

Embodiments described herein use ART and buffer concepts to provide a variety of systems that may be used in, for example, FinFETs. A FinFET is a transistor built around a thin strip of semiconductor material (referred to as the "fin"). The transistor includes the standard field effect transistor (FET) nodes/components: a gate, a gate dielectric, a source region, and a drain region. The conductive channel of the device resides on the outer sides of the fin beneath the gate dielectric. Specifically, current runs along both "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

Figure 3A:
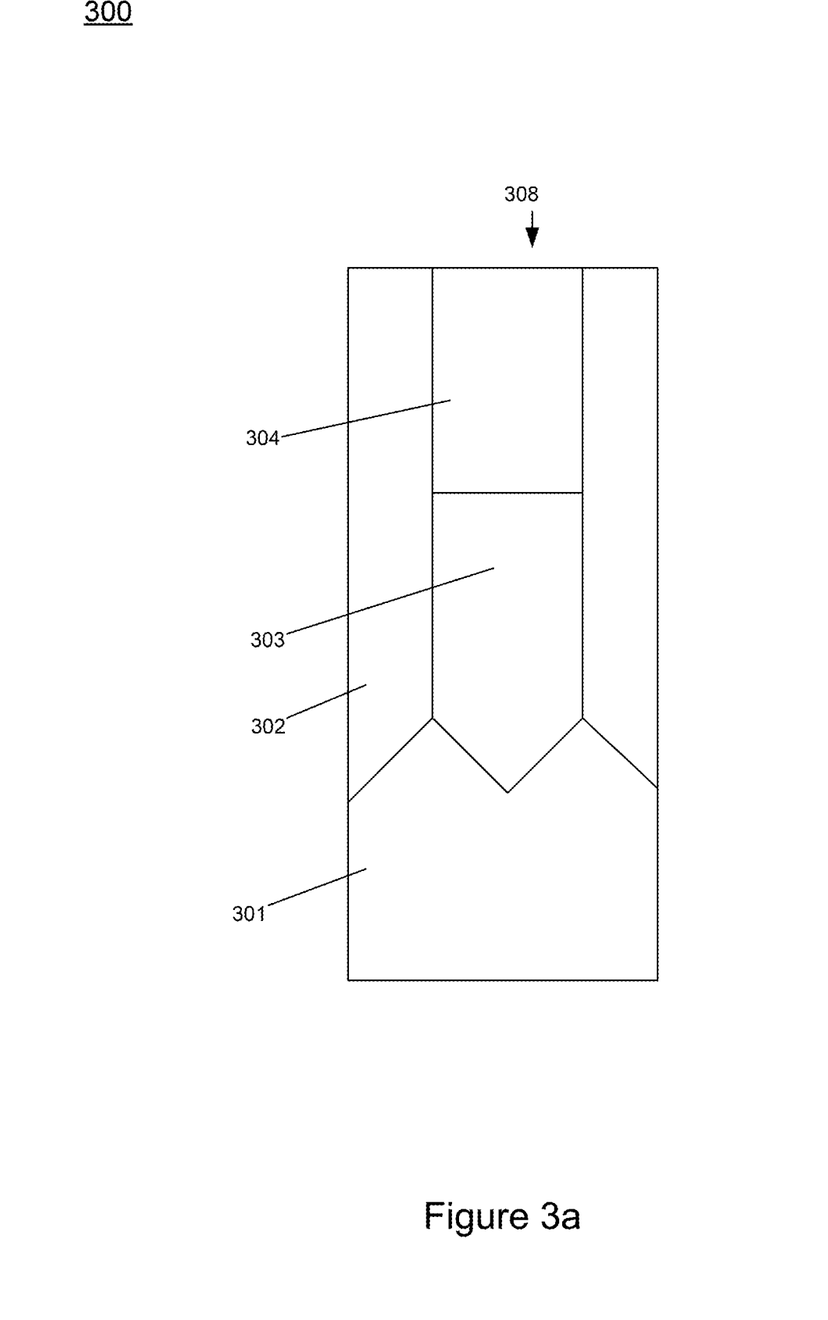
FIGS. 3(a) and 3(b) depict inconsistent application of elements across a fin.
Figure 3B:
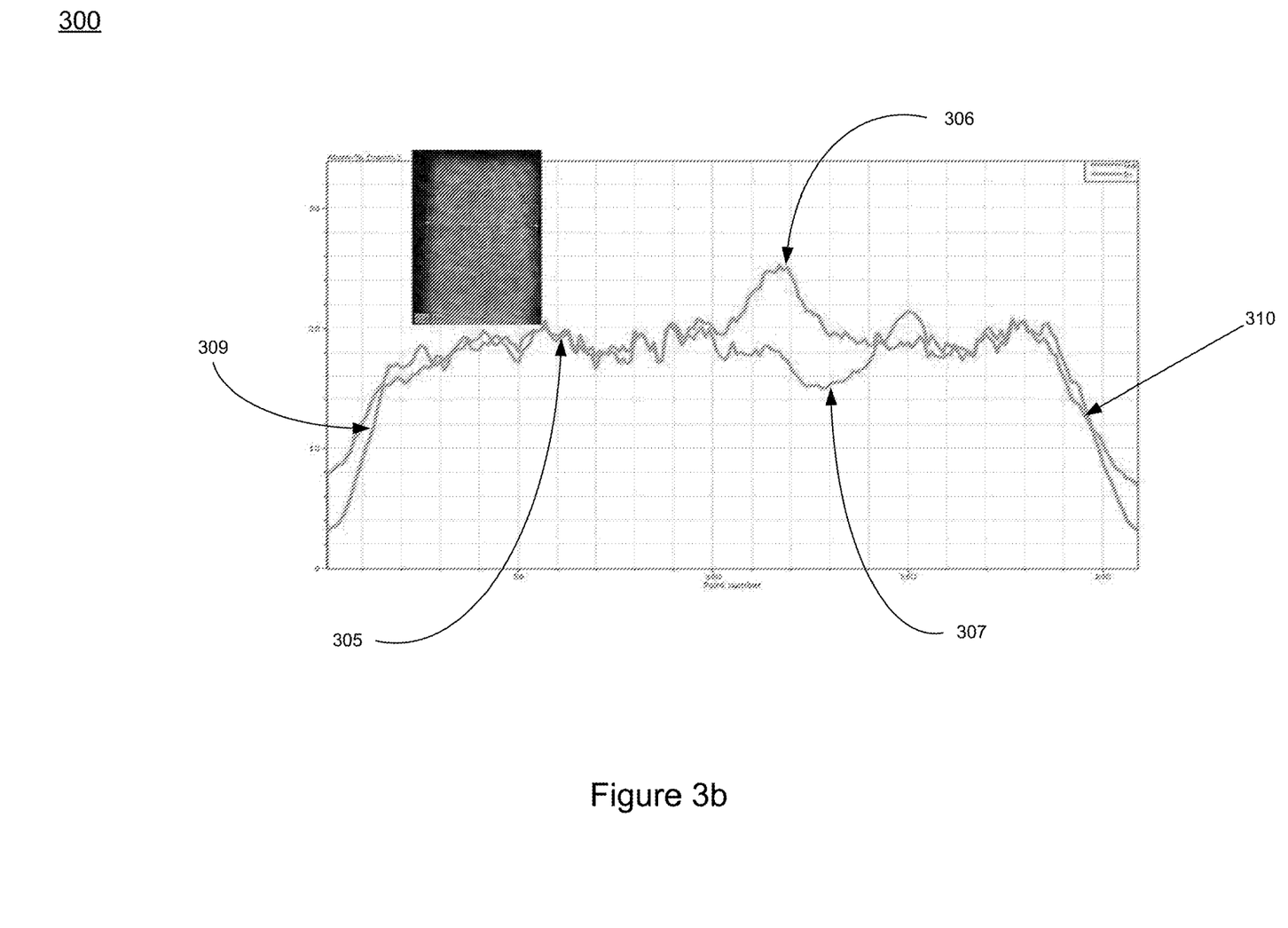

More specifically, embodiments address a problem identified by the Applicant. Growing ternary III-V materials into nanoscale trenches is very difficult and can result in high variability of elemental composition within a single fin and between different fins. For instance, FIGS. 3a and 3b illustrate the problem identified by the Applicant. In FIG. 3(a) device 300 includes substrate 301 and a fin, which includes buffer 303 and channel 304 and is within trench 308 of dielectric 302. Channel 304 may include a ternary material such as InGaAs while buffer 303 includes GaAs and/or InP or other compositions. FIG. 3(b) shows a cross-section of the fin of FIG. 3(a) showing the width of the fin with sidewalls of the fin depicted at locations 309, 310. In and Ga are present in substantially equal proportions at location 305 (e.g., $In_{(0.5)}Ga_{(0.5)}As$) but those proportions change with a dramatic increase in In at location 306 and a decrease in Ga at location 307. Area 306 depicts a 30% deviation in In content whereas area 305 depicts normal and acceptable variation of less than 5% deviation in In content. These inconsistencies are problematic for device yield and reliable operation of devices such as FinFETs. For example, the inconsistencies adversely result in threshold voltage (Vt) variation among FinFETs that may share a single power source. Applicant determined these inconsistencies may be due to the small confines of a nanoscale trench (e.g., a trench having a width between 5-30 nm) having an aspect ratio of 2:1 or greater and/or differing kinetics/migration rates for different elements (e.g., In and Ga) in the channel. Applicant determined the narrower the trench width, the higher the elemental (e.g., In and/or Ga) variation.

However, an embodiment addresses these problems by providing a superlattice in the channel, which improves material composition control within a single fin and between multiple fins. For instance, instead of growing a ternary material an embodiment instead forms alternating binary material layers (i.e., a superlattice) in a trench. By controlling the bilayer thickness one is able to improve the control of individual components of a material composition (e.g., In and Ga). Thickness of the bilayers can be controlled using, for example, atomic layer epitaxy of InAs/GaAs to achieve $In_{(0.5)}Ga_{(0.5)}As$. The embodiments are not limited to InGaAs channels and may include other material compositions such as ternary materials including, but not limited to, AlGaAs, InGaP, GaAsSb, InAsP, InAsSb, and the like (as well as non-ternary materials). Embodiments are not limited to atomic layer epitaxy and may use atomic layer deposition (ALD), chemical vapor deposition (CVD), and/or Molecular Beam Epitaxy (MBE). All of these methods may be used to form conformal layers in a superlattice of a FinFET channel. The bilayer thickness may be at nanometer scale whereby the thickness of each of the bilayers is less than 5 nm thick.

Figure 4:
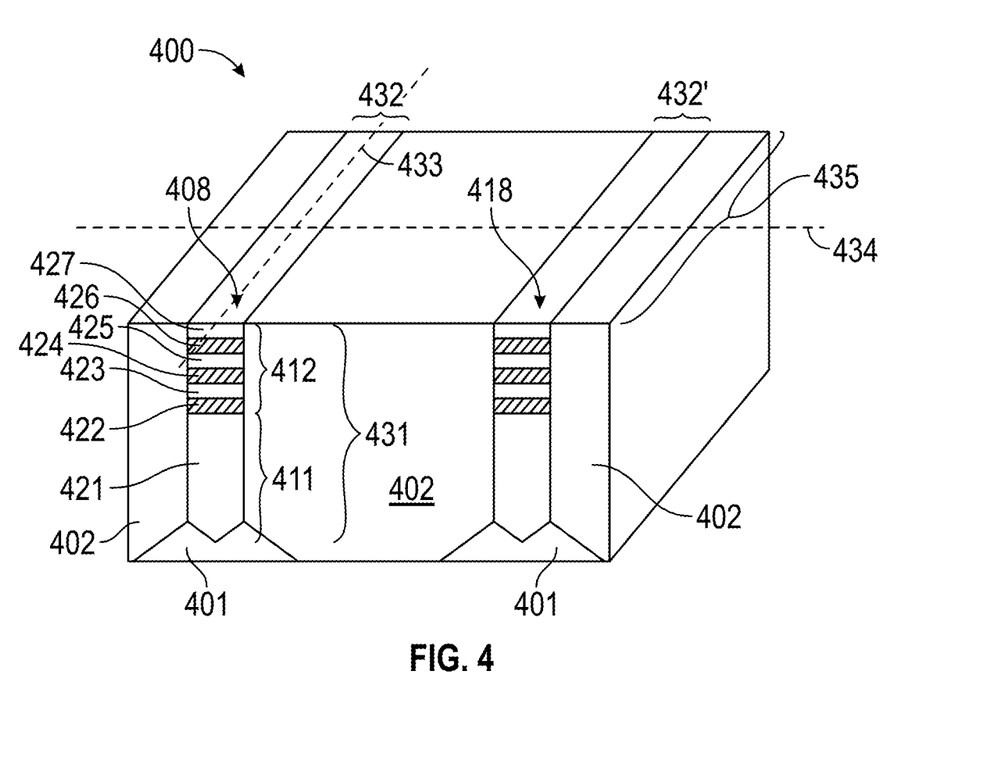
FIG. 4 depicts an embodiment including a superlattice in a channel of a FinFET.

FIG. 4 includes device 400, which comprises substrate 401 and dielectric layer 402 on the substrate and includes trenches 408, 418. Trench 408 will be discussed in greater detail however because trench 408 is representative of trench 418 in terms of physical structure and chemical composition. A first portion 411 of the trench includes a first layer 421. A second portion 412 of the trench includes second, third, fourth, and fifth layers 422, 423, 424, 425 as well as additional layers 426, 427. Layers 422, 423, 424, 425, 426, 427 collectively form a superlattice, which is a periodic structure of layers of two (or more) materials (which may change merely in concentration among elements or may include entirely different elements). The first portion 411 is between the second portion 412 and the substrate 401. The third layer 423 is between the second 422 and fourth 424 layers and directly contacts the second and fourth layers. The fourth layer 424 is between the third 423 and fifth 425 layers and directly contacts the third and fifth layers. Layers 426, 427 are not discussed in detail but are represented in physical structure and chemical composition by layers 422, 423.

The first layer 421 includes a first material such as GaAs and/or InP but this is not always the case in other embodiments. More generally, layer 421 is a buffer layer. In various embodiments the buffer layer may be any form of buffer that has a greater bandgap than the effective (collective) bandgap of the superlattice in portion 412. Buffer layer 421 has little to no impact on MOSFET threshold voltage (Vt). From a growth point of view, an embodiment may provide that layer 421 be lattice-matched to the lattice constant of portion 412. For example, when portion 412 includes $In_{0.5}Ga_{0.5}As$ formed by a InAs/GaAs superlattice, InP may be used for layer 421 because InP is lattice-matched to $In_{0.5}Ga_{0.5}As$.

The second and fourth layers 422, 424 include a second material such as InAs. The third and fifth layers 423, 425 include a third material such as GaAs. Thus, in an embodiment the second and third materials (e.g., layers 422, 423) have different chemical compositions from each other (e.g., InAs, GaAs). The first layer 421 is thicker than each of the second, third, fourth, and fifth layers 422, 423, 424, 425.

Each of layers 422, 423, 424, 425 may be 1-2 nm thick while the first layer 421 is more than 5 nm thick. In some embodiments the layers 422, 423, 424, 425 are less than 5 nm thick (e.g., 3 or 4 nm thick). In some embodiments layer 421 is the buffer layer and is designed to grade the strain from a Si substrate to the superlattice channel. As a result, layer 421 may be very thick (e.g., 5 nm, 10 nm, or more).

In an embodiment each of layers 422, 423, 424, 425 is generally less than 3 monolayers thick. For instance, in FIG. 5(a) the first layer 522 (analogous to layer 422) is a single monolayer thick (GaAs) as is the case with layer 523 (InAs). In various embodiments the first layer in the super lattice may include GaAs and the second layer includes InAs but in other embodiments the arrangement is reversed and the first layer includes InAs and the second layer includes GaAs. Further, in embodiments there may be other superlattice layers between layer 422 and layer 421 so just because layer 422 may be described as including InAs that does not mean that other embodiments may not have another layer of GaAs between layers 421, 422. A monolayer is defined as a single, closely packed layer of atoms or molecules (which is sometimes referred to as a self-assembled monolayer). For example, when a material is a bilayer material including two chemical components a monolayer includes a single layer of each component. More generally, when a material is a compound semiconductor including two chemical components such as III-V materials, a monolayer includes a single layer of each component. FIG. 5(b) shows an embodiment where the first layer 522' (analogous to layer 422) is two monolayers thick (GaAs) as is the case with layer 523' (InAs).

Returning to FIG. 4, each of the first, second, and third materials (layers 421, 422, 423) include at least one of a group III-V material and a group IV material. For example, the layers may respectively comprise InP, GaAs, InAs.

In device 400 the first material 421 has an energy bandgap greater than an energy bandgap for at least one of the second and third materials 422, 423. This may be needed to control, for example, subfin leakage current.

Trench 408 has an aspect ratio (depth 431 to width 432) of at least 2:1 but in other embodiments the ratio is 1.3:1, 1.4:1, 1.5:1, 1.6:1, 1.7:1, 1.8:1, 1.9:1, 2.1:1, 2.2:1 and greater.

In device 400 layers 422, 423, 424, 425 are included within a channel of a FinFET. The material of layer 422 is often discussed herein as including In but may include other elements such as Aluminum, Antimony. Further, the third material of layer 423 is often discussed herein as including Ga but may also include other materials in other embodiments. Generally, some embodiments use alternative binary superlattice layers to form ternary materials. For example, a channel including InGaAs is formed with InAs/GaAs superlattice layers or a channel including InAsSb is formed with InAs/InSb superlattice layers. Some embodiments include a channel including III-III'-V materials formed with III-V/III'-V superlattice layers. Some embodiments include a channel including III-V-V' formed with III-V/III-V' superlattice layers. In the above examples, group elements include Al, Ga, In and group V/V' elements include N, P, As, Sb.

In device 400 the second material 422 includes an additional member selected from the group consisting of Arsenic and Phosphorous and the third material 423 also includes the additional member. For example, both layers 422, 423 include As (InAs and GaAs).

In an embodiment, the second material 422 includes equal proportions of its bilayer materials and the same is true for the material of layer 423. Thus, layer 422 may include $In_{(0.5)}As_{(0.5)}$ ratio and layer 423 may include $Ga_{(0.5)}As_{(0.5)}$.

For device 400 the fin has a long axis 433 defining its length 435 and a short axis 434 defining its width 432. Layer 422 includes a generally consistent amount of components in its chemical composition across a majority of the width of the fin and along a majority of the length of the fin. For example, for a layer including InAs the amount of In is relatively consistent and avoids the major inconsistencies found at areas 306, 307 of FIG. 3(a). Thus, in an embodiment the amount of In (or other III-V or IV material) does not deviate by more than 5% along the majority of the width of the fin. In an embodiment the third layer 423 includes a generally consistent amount of In or Ga (or other III-V or IV material) across a majority of the width of the fin. In an embodiment the amount of In and/or Ga (or other III-V or IV material) does not deviate by more than 5% along the majority of the length 435 (along axis 433) of the fin.

In an embodiment, when growing binary material layers in a superlattice the composition is very consistent (III:V=1:1) in each layer of the superlattice. Further, in an embodiment the effective composition of portion 412 (i.e., the superlattice layers taken collectively) will have less than 5% variation collectively of III and V materials where, for example, in the case of InGaAs (a III-III'-V material) the III material includes In and the III' material includes Ga (i.e., the amounts of In and Ga do not deviate by more than 5% among the layers of the superlattice taken collectively thereby avoiding the scenario identified in, for example, FIG. 3b).

In an embodiment, the same is true "fin to fin". For example, in an embodiment the amount of In does not deviate by more than 5% along the majority of the width 432 of the fin (along axis 434) or along the width 432' of the fin in trench 418. The amount of In is consistent not only within a single fin but across more than one fin so that a FinFET using the superlattice of trench 408 will have close to the same voltage threshold as another FinFET using the superlattice of trench 418.

Thus, FIG. 4 illustrates a superlattice comprising alternating layers of binary (consisting of two elements) materials (e.g., InAs in layer 422 and GaAs in layer 423) that collective form a ternary channel (consisting of three elements) although quaternary (four elements) channels and the like are included in other embodiments.

As a side note, a band gap (also called an energy gap or bandgap) is an energy range in a solid where no electron states can exist. In graphs of the electronic band structure of solids, the band gap generally refers to the energy difference (in electron volts, or eV) between the top of the valence band and the bottom of the conduction band of the material. The band gap energy is equivalent to the energy required to free an outer shell electron from its orbit about the nucleus to become a mobile charge carrier that is able to move freely within the solid material.

In embodiments, dielectric 402 materials include, for example, insulating materials, such as, silicon dioxide ($SiO_2$), silicon oxynitride, silicon nitride, and/or high-k dielectric materials. In general, a high-k dielectric is a dielectric material having a dielectric constant greater than that of $SiO_2$. Exemplary high-k dielectric materials include hafnium dioxide ($HfO_2$), hafnium silicon oxide, lanthanum oxide, lanthanum aluminum oxide, zirconium dioxide ($ZrO_2$), zirconium silicon oxide, titanium dioxide ($TiO_2$), tantalum pentaoxide ($Ta_2O_5$), barium strontium titanium oxide, barium titanium oxide, strontium titanium oxide, yttrium oxide, aluminum oxide, lead scandium tantalum oxide, lead zinc niobate, and other materials known in the semiconductor art.

The base substrate on which a chip is built is typically a silicon wafer, although embodiments of the invention are not dependent on the type of substrate used. The substrate could also be comprised of germanium, indium antimonide, lead telluride, indium arsenide, indium phosphide, gallium arsenide, gallium antimonide, and/or other group III-V materials either alone or in combination with silicon or silicon dioxide or other insulating materials. A substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a SOI substrate. In an embodiment, the semiconductive substrate is a prominent structure such as a fin that extends above a bulk semiconductive material.

An embodiment includes a method comprising: (a) forming a dielectric layer on a substrate, (b) forming a trench within the dielectric layer, (c) forming a buffer layer in the bottom of the trench (wherein the buffer layer includes a material that will have a larger bandgap than at least one material to be used in a channel), (d) forming alternating layers (e.g., alternating binary layers) in a superlattice structure (wherein each superlattice layer is less than 5 nm thick and one of the layers includes a group III element (or group V element) and another of the layers includes a different group III element (or group V element)), and (e) including the superlattice structure in a channel of a FinFET.

Figure 6:
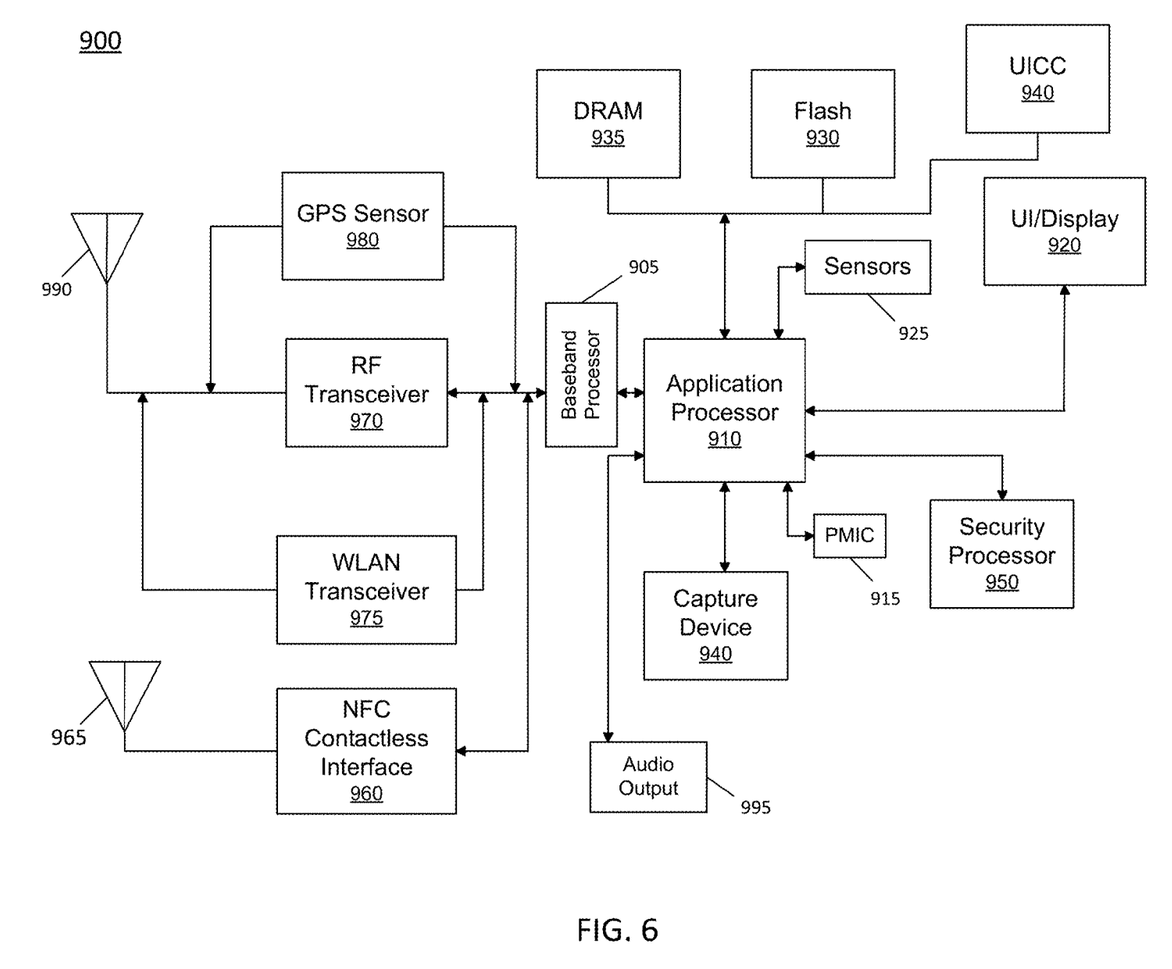
FIG. 6 includes a system that includes an embodiment.

Referring now to FIG. 6, shown is a block diagram of an example system with which embodiments can be used. As seen, system 900 may be a smartphone or other wireless communicator or any other IoT device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 5A:
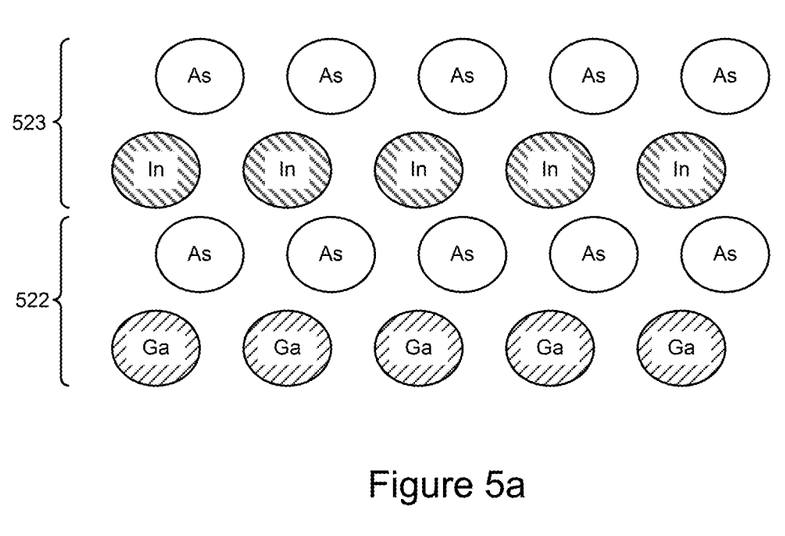
FIGS. 5(a) and 5(b) depict varying amounts of monolayers used in superlattice embodiments.
Figure 5B:
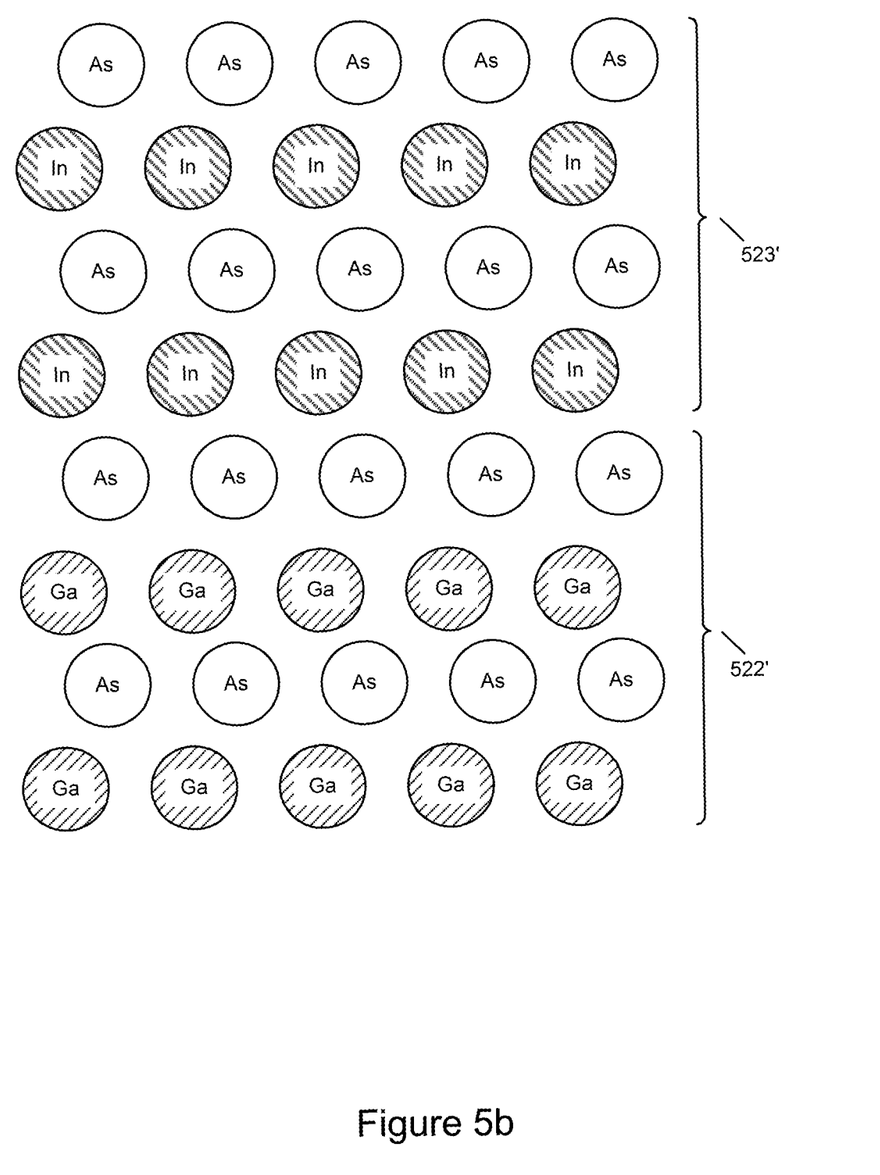

Embodiments, such as FinFETs including embodiments described herein (e.g., FIGS. 4, 5(*a*), and 5(*b*)) may be included in the above mentioned memories, processors, controllers, transceiver, and the like to thereby create more consistent yields (e.g., devices with consistent threshold voltages) for the system of FIG. 6 thereby adding value to the system.

Examples of embodiments follow.

Example 1 includes a device comprising: a substrate; a dielectric layer on the substrate and including a trench; a first portion of the trench including a first layer; a second portion of the trench including second, third, fourth, and fifth layers; wherein: (a)(i) the first portion is between the second portion and the substrate, (a)(ii) the third layer is between the second and fourth layers and directly contacts the second and fourth layers, (a)(ii) the fourth layer is between the third and fifth layers and directly contacts the third and fifth layers, (a)(iii) the first layer includes a first material, the second and fourth layers include a second material, and the third and fifth layers include a third material; (a)(iv) the second and third materials have different chemical compositions from each other; and (a)(vi) the first layer is thicker than each of the second, third, fourth, and fifth layers.

Example 2 includes the device of example 1 wherein each of the first, second, and third materials include at least one of a group III-V material and a group IV material.

Example 3 includes the device of example 2, wherein the first material has an energy bandgap greater than an energy bandgap for each of the second and third materials.

For example, the band offset between the layers may be >0.3 eV for electrons in the channel and >0.3 eV valence band offset for holes in the channel.

Other embodiments are not so limited. For example, this is not the case when buffer layer 421 includes InP (e.g., ~1.35 eV), layer 422 includes GaAs (e.g., ~0.36 eV), and layer 423 includes GaAs (e.g., ~1.42V). However, in such a case layer 421 still has a band gap greater than the effective bandgap of portion 412 (e.g., $In_{0.5}Ga_{0.5}As$ ~0.7 eV). In such a case, another version of example 3 includes the device of example 2, wherein the first material has an energy bandgap greater than an energy bandgap for at least one of the second and third materials.

Example 4 includes the device of example 3 wherein the trench has an aspect ratio (depth to width) of at least 2:1.

Example 5 includes the device of example 4 wherein the second, third, fourth, and fifth layers are each included within a channel of a fin-based field effect transistor (FinFET).

Example 6 includes the device of example 5 wherein each of the second, third, fourth, and fifth layers is less than 5 nm thick.

Example 7 includes the device of example 6 wherein: the second material includes a member selected from the group consisting of Indium, Aluminum, and Antimony; and the third material includes Gallium.

Another version of Example 7 includes the device of example 6 wherein: the second material includes a member selected from the group consisting of Indium, Aluminum, Gallium, Nitrogen, Phosphorous, Arsenic, and Antimony; and the third material includes another member which is unequal to the member and is selected from the group consisting of Indium, Aluminum, Gallium, Nitrogen, Phosphorous, Arsenic, and Antimony.

Another version of Example 7 includes the device of example 6 wherein: the second material includes a group III member; and the third material includes another group III member which is unequal to the member.

Example 8 includes the device of example 7 wherein the second material includes an additional member selected from the group consisting of Indium, Aluminum, Gallium, Nitrogen, Phosphorous, Arsenic, and Antimony and the third material also includes the additional member.

Another version of Example 8 includes the device of example 7 wherein the second material includes a group V material and the third material also includes the group V material.

Regarding the above versions of examples 7 and 8, for a "mixed group III case" (e.g., III-III'-V), the second material has III-V elements and the third material has III'-V elements. However, for a "mixed group V case" (e.g., III-V-V'), the second material has III-V elements, and the third material has III-V' elements. Regarding the above versions of examples 7 and 8, group materials include Al, Ga, In and group V/V' materials include N, P, As, Sb.

Example 9 includes the device of example 8 wherein the second material includes equal proportions of the member and the additional member and the third material includes equal proportions of Gallium and the additional member.

Example 10 includes the device of example 8 wherein: the second, third, fourth, and fifth layers are included in a fin of the FinFET; the fin has a long axis defining its length and a short axis defining its width; the second layer includes a generally consistent amount of the member across a majority of the width of the fin; the third layer includes a generally consistent amount of Gallium across a majority of the width of the fin.

Example 11 includes the device of example 10 wherein: the second layer includes a generally consistent amount of the member across a majority of the length of the fin; and the third layer includes a generally consistent amount of Gallium across a majority of the length of the fin.

Example 12 includes the device of example 10 comprising: an additional trench included in the dielectric layer; an additional first portion of the additional trench including an additional first layer; an additional second portion of the additional trench including additional second, additional third, additional fourth, and additional fifth layers; wherein: (a)(i) the additional first portion is between the additional second portion and the substrate, (a)(ii) the additional third layer is between the additional second and additional fourth layers and directly contacts the additional second and additional fourth layers, (a)(ii) the additional fourth layer is between the additional third and additional fifth layers and directly contacts the additional third and additional fifth layers, (a)(iii) the additional first layer includes the first material, the additional second and additional fourth layers include the second material, and the additional third and additional fifth layers include the third material; and (a)(iv) the additional first layer is thicker than each of the additional second, additional third, additional fourth, and additional fifth layers; the additional second, additional third, additional fourth, and additional fifth layers are included in an additional fin of an additional FinFET; the additional fin intersects the short axis which also defines an additional width of the additional fin; the additional second layer includes a generally consistent amount of the member across a majority of the additional width of the fin; the additional third layer includes a generally consistent amount of Gallium across a majority of the additional width of the additional fin.

Example 13 includes the device of example 6 wherein the second, third, fourth, and fifth layers collectively form a superlattice.

Example 14 includes the device of example 6 wherein each of the second, third, fourth, and fifth layers are conformal layers.

Example 15 includes the device of example 14 wherein each of the second, third, fourth, and fifth layers are deposited via a member selected from the group consisting of atomic layer deposition (ALD), chemical vapor deposition (CVD), and atomic layer epitaxy.

Example 16 includes the device of example 6 wherein each of the second, third, fourth, and fifth layers is generally less than 3 monolayers thick.

Example 17 includes the device of example 6 wherein each of the second and third materials is a binary material.

Example 18 includes the device of example 17 wherein the channel is a ternary channel based on the channel including the second and third materials.

Example 1a includes an apparatus comprising: a trench included in an insulation layer that is formed on a substrate, the trench having a top portion and a bottom portion between the top portion and the substrate; a first layer which comprises a first material and is included in the bottom portion; a superlattice in the trench on the first layer, the superlattice including a second layer, including a second material, which directly contacts a third layer that includes a third material; wherein (a) the second and third materials have different chemical compositions from each other, and (b) the first layer is thicker than each of the second, third, fourth, and fifth layers.

Example 2a includes the apparatus of example 1a wherein the second and third layers are each included within a channel of a fin-based field effect transistor (FinFET).

Example 3a includes the apparatus of example 2a wherein each of the second and third layers is less than 5 nm thick.

Example 4a includes the apparatus of example 3a wherein: the second material includes a member selected from the group consisting of Indium, Aluminum, and Antimony; and the third material includes Gallium.

Example 5a includes the apparatus of example 4a wherein the second material includes an additional member selected from the group consisting of Arsenic and Phosphorous and the third material also includes the additional member.

Example 6a includes the apparatus of example 5a wherein each of the second and third layers is a conformal layer.

Example 1b includes an apparatus comprising: a trench included in an insulation layer that is formed on a substrate, the trench having a top portion and a bottom portion between the top portion and the substrate; a first layer which comprises a first material and is included in the bottom portion; and a superlattice, in the trench and on the first layer, including second and third layers that directly contact each other; wherein: (a) the second and third layers respectively include second and third materials, (b) the second and third materials have different chemical compositions from each other, and (c) the first layer is thicker than each of the second and third.

Example 2b includes the apparatus of example 1b wherein the second and third layers are each included within a channel of a fin-based field effect transistor (FinFET).

Example 3b includes the apparatus of example 2b wherein each of the second and third layers is less than 5 nm thick.

Example 4b includes the apparatus of example 3b wherein: the second material includes a group III member; the third material includes an additional group III member unequal to the group III member included in the second material; the second material includes a group V member; and the third material includes the group V member.

Example 5b includes the apparatus of example 3b wherein: the second material includes a group V member; the third material includes an additional group V member unequal to the group V member included in the second material; the second material includes a group III member; and the third material includes the group III member.

Example 6b includes the apparatus of any of examples 1b to 5b wherein each of the second and third layers is a conformal layer.

Example 7b includes a device comprising: a substrate; a dielectric layer on the substrate and including a trench; a first portion of the trench including a first layer; a second portion of the trench including second, third, fourth, and fifth layers; wherein: (a)(i) the first portion is between the second portion and the substrate, (a)(ii) the third layer is between the second and fourth layers and directly contacts the second and fourth layers, (a)(ii) the fourth layer is between the third and fifth layers and directly contacts the third and fifth layers, (a)(iii) the first layer includes a first material, the second and fourth layers include a second material, and the third and fifth layers include a third material; (a)(iv) the second and third materials have different chemical compositions from each other; and (a)(vi) the first layer is thicker than each of the second, third, fourth, and fifth layers.

Example 8b includes the device of example 7b wherein each of the first, second, and third materials include at least one of a group III-V material and a group IV material.

Example 9b includes the device of example 8b, wherein the first material has an energy bandgap greater than an energy bandgap for at least one of the second and third materials.

Example 10b includes the device of example 9b wherein the trench has an aspect ratio (depth to width) of at least 2:1.

Example 11b includes the device of example 10b wherein the second, third, fourth, and fifth layers are each included within a channel of a fin-based field effect transistor (FinFET).

Example 12b includes the device of example 11b wherein each of the second, third, fourth, and fifth layers is less than 5 nm thick.

Example 13b includes the device of example 12b wherein: the second material includes a group III member; the third material includes an additional group III member unequal to the group III member included in the second material; the second material includes a group V member; and the third material includes the group V member.

Example 14b includes the device of example 13b wherein: the second, third, fourth, and fifth layers are included in a fin of the FinFET; the fin has a long axis defining its length and a short axis defining its width; the second layer includes a generally consistent amount of the group III member across a majority of the width and a majority of the length of the fin; and the third layer includes a generally consistent amount the additional group III member across a majority of the width and a majority of the length of the fin.

Example 15b includes the device of example 14b comprising: an additional trench included in the dielectric layer; an additional first portion of the additional trench including an additional first layer; an additional second portion of the additional trench including additional second, additional third, additional fourth, and additional fifth layers; wherein: (a)(i) the additional first portion is between the additional second portion and the substrate, (a)(ii) the additional third layer is between the additional second and additional fourth layers and directly contacts the additional second and additional fourth layers, (a)(ii) the additional fourth layer is between the additional third and additional fifth layers and directly contacts the additional third and additional fifth layers, (a)(iii) the additional first layer includes the first material, the additional second and additional fourth layers include the second material, and the additional third and additional fifth layers include the third material; and (a)(iv) the additional first layer is thicker than each of the additional second, additional third, additional fourth, and additional fifth layers; the additional second, additional third, additional fourth, and additional fifth layers are included in an additional fin of an additional FinFET; the additional fin intersects the short axis which also defines an additional width of the additional fin; the additional second layer includes a generally consistent amount of the group III member across a majority of the additional width of the fin; and the additional third layer includes a generally consistent amount of the additional group III member across a majority of the additional width of the additional fin.

Example 16b includes the device of example 12b wherein: the second material includes a group V member; the third material includes an additional group V member unequal to the group V member included in the second material; the second material includes a group III member; and the third material includes the group III member.

Example 17b includes the device of example 16b wherein: the second, third, fourth, and fifth layers are included in a fin of the FinFET; the fin has a long axis defining its length and a short axis defining its width; the second layer includes a generally consistent amount of the group V member across a majority of the width and a majority of the length of the fin; and the third layer includes a generally consistent amount the additional group V member across a majority of the width and a majority of the length of the fin.

Example 18b includes the device of any of examples 7b to 17b wherein the second material includes equal proportions of group III and V members and the third material includes equal proportions of group III and V members.

Example 19b includes the device of any of examples 7b to 17b wherein the second, third, fourth, and fifth layers collectively form a superlattice.

Example 20b includes the device of any of examples 7b to 17b wherein each of the second, third, fourth, and fifth layers are conformal layers.

Example 21b includes the device of example 20b wherein each of the second, third, fourth, and fifth layers are deposited via a member selected from the group consisting of atomic layer deposition (ALD), chemical vapor deposition (CVD), molecular beam epitaxy (MBE), and atomic layer epitaxy.

Example 22b includes the device of example any of examples 7b to 17b wherein each of the second, third, fourth, and fifth layers is generally less than 3 monolayers thick.

Example 23b includes the device of example any of examples 7b to 17b wherein each of the second and third materials is a binary material.

Example 24b includes the device of example 23b wherein the channel is a ternary channel based on the channel including the second and third materials.

Example 25b includes a system comprising: a memory; and a processor coupled to the memory, wherein at least one of the processor and the memory includes a transistor according to any one of examples 7b to 17b.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a trench included in an insulation layer that is formed on a substrate, the trench having a top portion and a bottom portion between the top portion and the substrate;
   a first layer which comprises a first material and is included in the bottom portion; and
   a superlattice, in the trench and on the first layer, including second and third layers that directly contact each other;
   wherein: (a) the second and third layers respectively include second and third materials, (b) the second and third materials have different chemical compositions from each other, (c) the first layer is thicker than each of the second and third layers, and (d) the trench has an aspect ratio (depth to width) of at least 2:1.

2. The apparatus of claim 1 wherein the second and third layers are each included within a channel of a fin-based field effect transistor (FinFET).

3. The apparatus of claim 2 wherein each of the second and third layers is less than 5 nm thick.

4. The apparatus of claim 3 wherein:
   the second material includes a group III member;
   the third material includes an additional group III member unequal to the group III member included in the second material;
   the second material includes a group V member; and
   the third material includes the group V member.

5. The apparatus of claim 3 wherein:
   the second material includes a group V member;
   the third material includes an additional group V member unequal to the group V member included in the second material;
   the second material includes a group III member; and
   the third material includes the group III member.

6. The apparatus of claim 4 wherein each of the second and third layers is a conformal layer.

7. A device comprising:
   a substrate;
   a dielectric layer on the substrate and including a trench;
   a first portion of the trench including a first layer;
   a second portion of the trench including second, third, fourth, and fifth layers;
   wherein: (a)(i) the first portion is between the second portion and the substrate, (a)(ii) the third layer is between the second and fourth layers and directly contacts the second and fourth layers, (a)(ii) the fourth layer is between the third and fifth layers and directly contacts the third and fifth layers, (a)(iii) the first layer includes a first material, the second and fourth layers include a second material, and the third and fifth layers include a third material; (a)(iv) the second and third materials have different chemical compositions from each other; (a)(vi) the first layer is thicker than each of the second, third, fourth, and fifth layers, and (a)(vii) the trench has an aspect ratio (depth to width) of at least 2:1.

8. The device of claim 7 wherein each of the first, second, and third materials include at least one of a group III-V material or a group IV material.

9. The device of claim 8, wherein the first material has an energy bandgap greater than an energy bandgap for at least one of the second or third materials.

10. The device of claim 7 wherein the second, third, fourth, and fifth layers are each included within a channel of a fin-based field effect transistor (FinFET).

11. The device of claim 10 wherein each of the second, third, fourth, and fifth layers is less than 5 nm thick.

12. The device of claim 11 wherein:
    the second material includes a group III member;
    the third material includes an additional group III member unequal to the group III member included in the second material;
    the second material includes a group V member; and
    the third material includes the group V member.

13. The device of claim 12 wherein:
    the second, third, fourth, and fifth layers are included in a fin of the FinFET;
    the fin has a long axis defining its length and a short axis defining its width;
    the second layer includes a generally consistent amount of the group III member across a majority of the width of the fin; and
    the third layer includes a generally consistent amount of the additional group III member across a majority of the width of the fin.

14. The device of claim 13 comprising:
    an additional trench included in the dielectric layer;
    an additional first portion of the additional trench including an additional first layer;
    an additional second portion of the additional trench including additional second, additional third, additional fourth, and additional fifth layers;
    wherein: (a)(i) the additional first portion is between the additional second portion and the substrate, (a)(ii) the additional third layer is between the additional second and additional fourth layers and directly contacts the additional second and additional fourth layers, (a)(ii) the additional fourth layer is between the additional third and additional fifth layers and directly contacts the additional third and additional fifth layers, (a)(iii) the additional first layer includes the first material, the additional second and additional fourth layers include the second material, and the additional third and additional fifth layers include the third material; and (a)(iv) the additional first layer is thicker than each of the additional second, additional third, additional fourth, and additional fifth layers;

the additional second, additional third, additional fourth, and additional fifth layers are included in an additional fin of an additional FinFET;

the additional fin intersects the short axis which also defines an additional width of the additional fin;

the additional second layer includes a generally consistent amount of the group III member across a majority of the additional width of the fin; and the additional third layer includes a generally consistent amount of the additional group III member across a majority of the additional width of the additional fin.

15. The device of claim 11 wherein:

the second material includes a group V member;

the third material includes an additional group V member unequal to the group V member included in the second material;

the second material includes a group III member; and the third material includes the group III member.

16. The device of claim 15 wherein:

the second, third, fourth, and fifth layers are included in a fin of the FinFET;

the fin has a long axis defining its length and a short axis defining its width;

the second layer includes a generally consistent amount of the group V member across a majority of the width and a majority of the length of the fin; and the third layer includes a generally consistent amount of the additional group V member across a majority of the width and a majority of the length of the fin.

17. The device of claim 12 wherein the second material includes equal proportions of group III and V members and the third material includes equal proportions of group III and V members.

18. The device of claim 12 wherein the second, third, fourth, and fifth layers collectively form a superlattice.

19. The device of claim 12 wherein each of the second, third, fourth, and fifth layers are conformal layers.

20. The device of claim 19 wherein each of the second, third, fourth, and fifth layers are deposited via at least one of atomic layer deposition (ALD), chemical vapor deposition (CVD), molecular beam epitaxy (MBE), atomic layer epitaxy, or combinations thereof.

21. The device of claim 12 wherein each of the second, third, fourth, and fifth layers is generally less than 3 monolayers thick.

22. The device of claim 12 wherein each of the second and third materials is a binary material.

23. The device of claim 22 wherein the channel is a ternary channel based on the channel including the second and third materials.

24. A system comprising:

a memory; and a processor coupled to the memory, wherein at least one of the processor and the memory includes a transistor according to claim 12.

25. The apparatus of claim 1, wherein the width is defined at a bottom edge of the trench.

* * * * *